(12) United States Patent
Lee

(10) Patent No.: US 8,659,320 B2
(45) Date of Patent: Feb. 25, 2014

(54) DIGITAL LOGIC CIRCUIT WITH DYNAMIC LOGIC GATE

(75) Inventor: Hyoungwook Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/278,550

(22) Filed: Oct. 21, 2011

(65) Prior Publication Data

US 2012/0119784 A1    May 17, 2012

(30) Foreign Application Priority Data

Nov. 12, 2010 (KR) ................. 10-2010-0112834

(51) Int. Cl.
*H03K 19/096* (2006.01)

(52) U.S. Cl.
USPC ............................................. 326/95; 326/98

(58) Field of Classification Search
USPC ................ 326/93, 95–98; 327/199–201, 208, 327/212–214, 225
See application file for complete search history.

(56) References Cited

U.S. PATENT DOCUMENTS

| 6,549,038 | B1 * | 4/2003 | Sechen et al. | 326/93 |
| 7,932,750 | B2 * | 4/2011 | Kim | 326/93 |
| 2004/0104745 | A1 * | 6/2004 | Bosshart | 326/98 |

FOREIGN PATENT DOCUMENTS

| KR | 10-1998-0070718 A | 10/1998 |
| KR | 10-2002-0019626 A | 3/2002 |
| KR | 10-0737550 B1 | 7/2007 |
| KR | 10-0922696 A | 10/2009 |

* cited by examiner

*Primary Examiner* — James H Cho
(74) *Attorney, Agent, or Firm* — Sughrue Mion, PLLC

(57) ABSTRACT

A digital logic gate suitable for a high-speed operation of a central processing unit. The digital logic gate comprises the first dynamic logic gate configured to logically gate a plurality of first input data in response to the first clock signal, a second dynamic logic gate configured to logically gate a gating output of the first dynamic logic gate and a plurality of second input data, and a latching device configured to latch a gating output of the second dynamic logic gate. The digital logic circuit need not adopt a keeper circuit, and thus a gate delay is reduced and the digital logic circuit performs a high-speed gating operation with robust characteristic against a current leakage or an input noise.

7 Claims, 17 Drawing Sheets

DIGITAL LOGIC CIRCUIT WITH DYNAMIC LOGIC GATE

CROSS-REFERENCE TO RELATED PATENT APPLICATION

This application claims priority from Korean Patent Application No. 10-2010-0112834 filed Nov. 12, 2010 in the Korean Intellectual Property Office, the contents of which are incorporated herein by reference in their entirety.

BACKGROUND

1. Field

Exemplary embodiments relate to a digital logic circuit, and more particularly, to a digital logic circuit having a dynamic logic gate.

2. Description of the Related Art

As a need for a high-speed performance on a mobile CPU increases, logic gates adopted for logic operations of the mobile CPU increasingly become important.

General circuit design manners may make it possible to realize a stable circuit of a large noise resistance and to conduct static timing analysis (STA) relatively easily. But, the number of allowed inputs of one stage is limited, and an operating speed becomes slow due to an increase in stacks.

Meanwhile, in a circuit design manner using a dynamic logic gate, a domino gate is widely used to improve an operating speed. But, it is difficult to apply the domino gate to a conventional synthesis manner. Further, the domino gate is vulnerable to an input noise or a current leakage. One problem may arise when a keeper is used to improve the performance of the domino gate. That is, a gate delay may increase largely due to fighting.

SUMMARY

An object of the exemplary embodiments is directed to providing a dynamic logic gate having excellent operating performance and consuming low power.

Another object of the exemplary embodiments is directed to providing a dynamic logic gate capable of easily applying to a synthesis manner and having a strong characteristic against a leakage or an input noise.

Still another object of the exemplary embodiments is directed to providing a digital logic gate capable of performing logic gating in a high speed without applying a keeper circuit to a logic gate.

Still another object of the exemplary embodiments is directed to providing a technique capable of easily embedding a logic gate in a flip-flop and increasing a chip design speed.

One aspect of the exemplary embodiments is directed to a digital logic circuit which comprises a first dynamic logic gate that logically gates a plurality of first input data in response to a first clock signal, and outputs a first gating output; a second dynamic logic gate that logically gates the first gating output of the first dynamic logic gate and a plurality of second input data in response to a first pulse signal and a second pulse signal, and outputs a second gating output; a latching device that latches the second gating output of the second dynamic logic gate; and a pulse signal generating unit that generates the first and second pulse signals in response to the first clock signal.

The first dynamic logic gate may include a pre-charge transistor having a gate connected to receive the first clock signal and a source connected with a power supply terminal; a discharge transistor having a gate connected to receive the first clock signal and a ground source; and a pull-down network connected between a drain of the pre-charge transistor and a drain of the discharge transistor and receiving the plurality of first input data.

The second dynamic logic gate may include a pre-charge transistor having a gate connected to receive the first pulse signal and a source connected with the power supply terminal; a discharge transistor having a gate connected to receive the second pulse signal and a ground source; and a pull-down network connected between a drain of the pre-charge transistor and a drain of the discharge transistor and receiving the first gating output of the first dynamic logic gate and the plurality of second input data.

The pulse signal generating unit may include a delay unit that generates the first pulse signal by delaying the first clock signal; and a pulse generator that generates the second pulse signal by delaying and gating the first clock signal.

Another aspect of the exemplary embodiments is directed to a digital logic circuit which comprises a first dynamic logic gate that logically gates a plurality of first input data in response to a first clock signal, and outputs a first gating output; a second dynamic logic gate that logically gates the first gating output of the first dynamic logic gate and a plurality of second input data in response to a first pulse signal, and outputs a second gating output; a latching device that latches the second gating output of the second dynamic logic gate; and a pulse signal generating unit that generates the first pulse signal in response to the first clock signal.

The first dynamic logic gate may include a pre-charge transistor having a gate connected to receive the first clock signal and a source connected with a power supply terminal; a discharge transistor having a gate connected to receive the first clock signal and a ground source; and a pull-down network connected between a drain of the pre-charge transistor and a drain of the discharge transistor and receiving the plurality of first input data.

The second dynamic logic gate may include a pre-charge transistor having a gate connected to receive the first pulse signal and a source connected with the power supply terminal; a discharge transistor having a gate connected to receive the first pulse signal and a ground source; and a pull-down network connected between a drain of the pre-charge transistor and a drain of the discharge transistor and receiving the first gating output of the first dynamic logic gate and the plurality of second input data.

The pulse signal generating unit may include a pulse generator that generates the first pulse signal by delaying and gating the first clock signal.

The second dynamic logic gate may include a pre-charge transistor having a gate connected to receive the first pulse signal and a source connected with a power supply terminal; a discharge transistor having a gate connected to receive a delay pulse signal and a ground source; a sub-discharge transistor having a gate connected to receive the first pulse signal and a source connected with a drain of the discharge transistor; a delay unit that generates the delay pulse signal by delaying the first pulse signal; and a pull-down network connected between a drain of the pre-charge transistor and a drain of the sub-discharge transistor and receiving the first gating output of the first dynamic logic gate and the plurality of second input data.

The pulse signal generating unit may include a delay unit that generates the first pulse signal in a clock shape by delaying the first clock signal.

The latching device may include a first NAND gate generating a NAND response on an output node in response to receiving the second gating output of the second dynamic logic gate via a first input node and a feedback NAND output signal received via a second input node; and a second NAND gate having a first input terminal connected with an output node of the first NAND gate and a second input terminal connected with a first clock signal being delayed and inverted, the second NAND gate generating the feedback NAND output signal.

The latching device inversely latches the second gating output of the second dynamic logic gate during a first transition period of the first pulse signal.

Another aspect of the exemplary embodiments provides a digital logic circuit which comprises an N-stage dynamic logic gate that logically gates a plurality of first to Nth input data in response to first to Nth clock signals, the second to Nth clock signals being generated by sequentially delaying the first clock signal; a second dynamic logic gate that logically gates a last gating output of the N-stage dynamic logic gate and a plurality of last input data in response to a first pulse signal and a second pulse signal; a latching device that latches a gating output of the second dynamic logic gate; and a pulse signal generating unit that generates the first and second pulse signals in response to the Nth clock signal.

The first stage logic gate of the N-stage dynamic logic gate may include a pre-charge transistor having a gate connected to receive the first clock signal and a source connected with the power supply terminal; a discharge transistor having a gate connected to receive the first clock signal and a ground source; and a pull-down network connected between a drain of the pre-charge transistor and a drain of the discharge transistor and receiving the plurality of first input data.

The second dynamic logic gate may include a pre-charge transistor having a gate connected to receive the first pulse signal and a source connected with the power supply terminal; a discharge transistor having a gate connected to receive the first pulse signal and a ground source; and a pull-down network connected between a drain of the pre-charge transistor and a drain of the discharge transistor and receiving the last gating output of the N-stage dynamic logic gate and a plurality of last input data.

BRIEF DESCRIPTION OF THE FIGURES

The above and other aspects will become apparent from the following description with reference to the following figures, wherein like reference numerals refer to like parts throughout the various figures unless otherwise specified, and wherein.

DETAILED DESCRIPTION OF EXEMPLARY EMBODIMENTS

Figure 1:
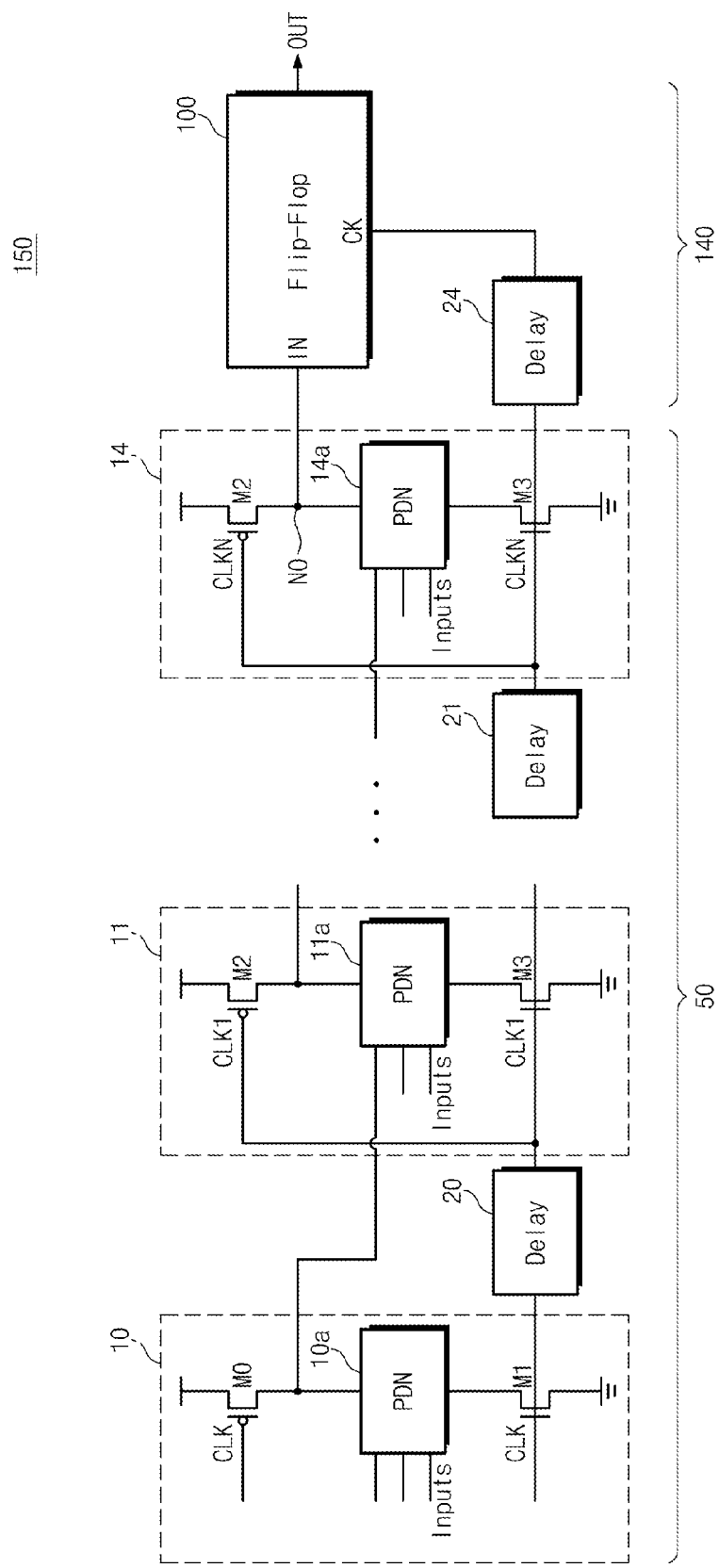
FIG. 1 is a block diagram of a digital logic circuit according to an exemplary embodiment.

The exemplary embodiments are described more fully hereinafter with reference to the accompanying drawings, in which the exemplary embodiments are shown. The exemplary embodiments may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Spatially relative terms, such as "beneath", "below", "lower", "under", "above", "upper" and the like, may be used herein for ease of description to describe one element or feature's relationship to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it may be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this disclosure relates. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the figures, the same or similar reference symbols may be used to represent the same or similar constituent elements. In some figures, interconnection of elements and lines may be used to effectively describe the exemplary embodiments. Other elements or circuit blocks may be further provided.

Exemplary embodiments disclosed therein may include their complementary exemplary embodiments. Note that detailed operations and functions of a dynamic logic gate and generation operations of a pulse generator or a latch circuit may be skipped to prevent concepts from becoming ambiguous.

Figure 2:
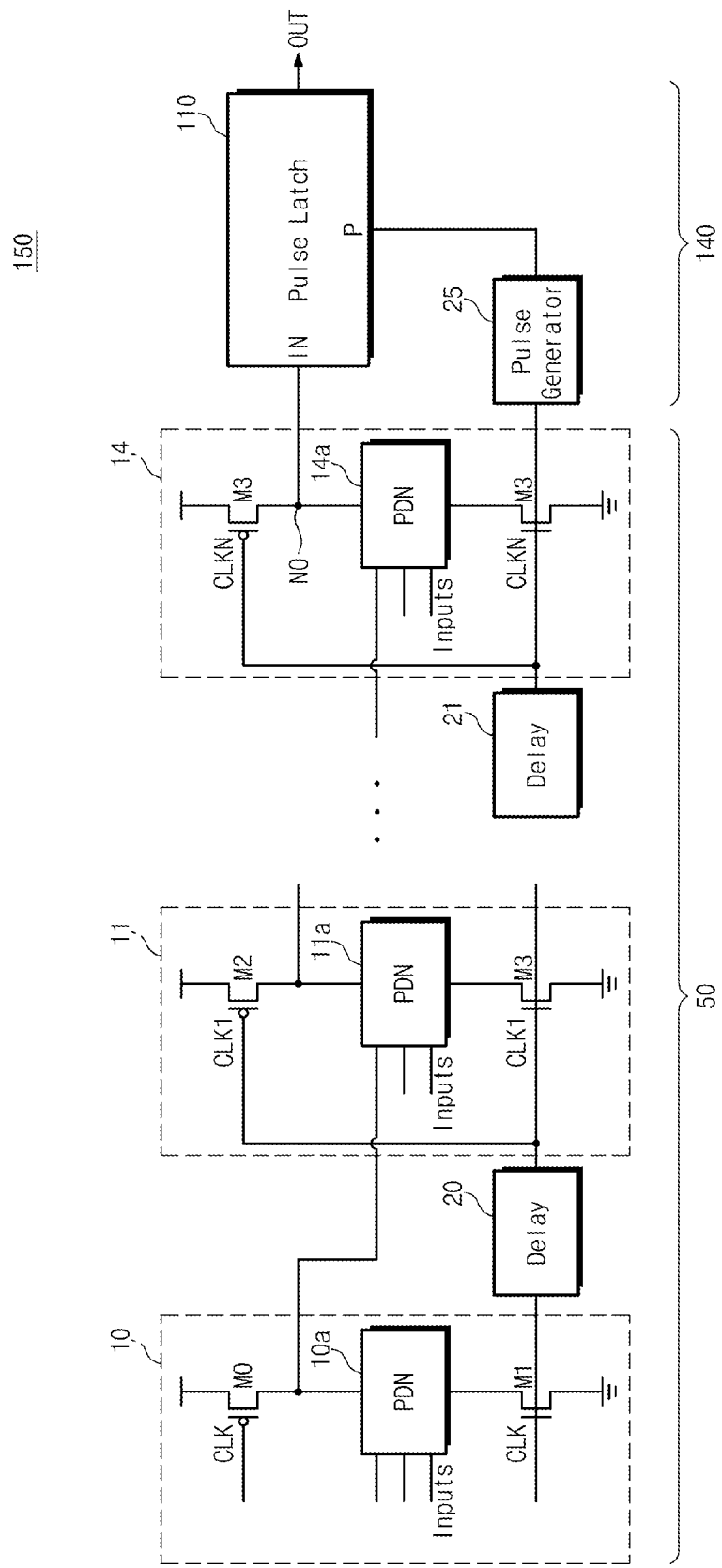
FIG. 2 is a block diagram of a digital logic circuit according to an exemplary embodiment.

FIG. 1 is a block diagram of a digital logic circuit according to an exemplary embodiment. FIG. 2 is a block diagram of a digital logic circuit according to an exemplary embodiment.

Referring to FIG. 1, a digital logic circuit 150 may include an N-stage dynamic logic gate 50 and a flip-flop part 140.

The N-stage dynamic logic gate 50 may include dynamic logic gates 10, 11, ..., 14 which are cascade connected to logically gate the first to N input data sequentially, in response to the first to Nth clock signals CLK to CLKN. The clock signal CLK1 to CLKN may be generated by delay part 20, 21 delaying the first clock signal CLK sequentially.

The flip-flop part 140 may include a D-type flip-flop 100 and a delay part 24. The D-type flip-flop 100 may be configured to latch a gating output N0 of the N-state dynamic logic gate 14 according to a delay clock. The delay part 24 may be configured to generate the delay clock, which is applied to the D-type flip-flop 100.

The dynamic logic gate 10 placed at the first stage of the N-stage dynamic logic gate 50 may include a pre-charge transistor M0, a discharge transistor M1, and a pull-down network 10a.

The pre-charge transistor M0 may be formed of a PMOS transistor which has a gate connected to receive the first clock signal CLK and a source connected to a power supply (VDD) terminal.

The discharge transistor M1 may be formed of an NMOS transistor which has a gate connected to receive the first clock CLK and a source connected to a ground (VSS) terminal.

Figure 3:
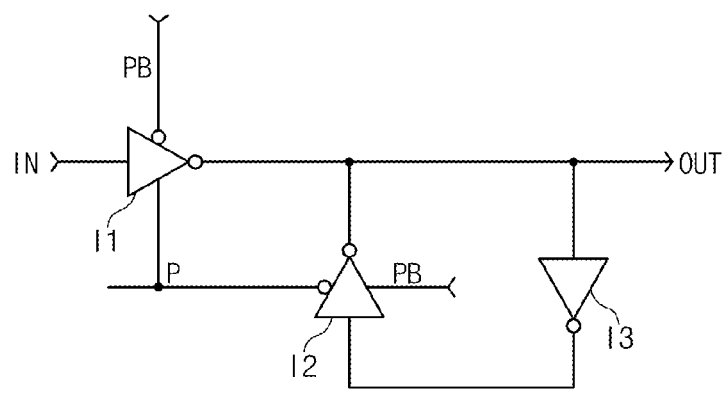
FIG. 3 shows a detailed circuit of a pulse latch according to an exemplary embodiment.

The pull-down network 10a may be connected between a drain of the pre-charge transistor M0 and a drain of the discharge transistor M1 and receive a plurality of first input data INPUTS. If the pull-down network 10a performs a 3-input NAND gating operation, it may be formed of three NMOS transistors whose channels are connected in series. Further, if the pull-down network 10a performs a 3-input NOR gating operation, it may be formed of three NMOS transistors whose channels are connected in parallel. In FIG. 3, the pull-down network 10a may be connected between the pre-charge transistor M0 and the discharge transistor M1. But, the pull-down network 10a can be connected between the discharge transistor M1 and the ground terminal.

Below, an operation of the dynamic logic gate 10 will be described simply.

First, it is assumed that the plurality of first input data is '111' and a NAND gating operation is performed. Accordingly, a charging operation may be performed within a low-level period of the first clock signal CLK, and an execution operation may be carried out within a high-level period of the first clock signal CLK.

At the charging operation, the pre-charge transistor M0 may be turned on, and the discharge transistor M1 may be turned off. This means that an output node, that is, a voltage of the drain of the pre-charge transistor M0 increases. As a result, the output node may be set to a logical high level.

Meanwhile, at the execution operation, the pre-charge transistor M0 may be turned off, and the discharge transistor M1 may be turned on. Further, three NMOS transistors of the pull-down network 10a may be turned on. This means that a voltage of the output node is discharged through a current path connected with a ground. As a result, the output node may be set to a logical low level. Accordingly, a result of the 3-input NAND gating operation may represent a logic low level. If the first input data is '101', a voltage of the output node may be set to a logical high level.

The gating output of the output terminal may be applied to the second stage dynamic logic gate 11. A pull-down network 11a of the second-stage dynamic logic gate 11 may perform a logic operation in response to the gating output of the first stage dynamic logic gate 10 and a plurality of second input data. In this case, a pre-charge transistor M2 and a discharge transistor M3 may operate responsive to the second clock signal CLK1 outputted through a delay unit 20. That is, the charging and execution operations may be performed according to a state of the second clock signal CLK1.

Unlike a domino gate, where the same clock is applied to each gate stage, the circuit in FIG. 1 may take a manner of delaying a clock signal sequentially via a delay chain, applying the delayed clocks to respective gate stages, and capturing a gating output using a flip-flop placed at the last stage.

Herein, a delay of each of delay units constituting the delay chain may be set to be similar to or more than a propagation delay of a dynamic gate stage. The circuit configuration in FIG. 1 may enable a dynamic gate to be embedded in a flip-flop easily or rapidly. Further, the circuit configuration in FIG. 1 may enable a delay of a delay cell to be calculated, with the delay being absorbed by a setup time. Accordingly, it is possible to improve a chip design speed by freely using a delay cell through a synthesis tool.

The circuit in FIG. 1 may use the flip-flop 100 placed at the latter part of a dynamic logic gate. Accordingly, an additional keeper circuit is not needed because data validity is secured only within a sampling window period of the flip-flop 100. If a gating output applied to the flip-flop 100 at a low period of the delay clock is determined as '0' or '1', it may be transferred to an output terminal OUT at a rising edge of the delay clock, and then a data variation of the gating output may be ignored. That is, the circuit in FIG. 1 may utilize a technique of using a difference between a transfer speed of valid data and a transfer speed of an unknown signal due to a leakage or a noise. As a result, once a valid signal arrives within a sampling window of the flip-flop 100 and the signal is captured, damage to data may be prevented although an unknown signal arrives afterwards.

A conventional circuit design may necessitate a keeper circuit. But, as illustrated in FIG. 1, no keeper circuit may be adopted to operate in high speed and to prevent unnecessary fighting. In the circuit in FIG. 1, an input may be maintained until data is captured by the flip-flop 100. This means that a data input noise characteristic is improved.

In an exemplary embodiment, a dynamic logic gate may not use a keeper circuit. As illustrated in FIG. 1, if a dynamic logic gate and a pulse latch are combined, an operating speed is rapid and it is not vulnerable to a leakage or an input noise. Further, it is possible to easily apply to a conventional static timing analysis flow.

Since a typical domino gate uses only NMOS logic as compared with a static gate, its fan-in may be small, and many signals may be combined in an OR manner. Accordingly, the domino gate may be favorable to a high-speed circuit design. But, the domino gate may have the following problems.

One problem may be that a signal must be mixed with a clock CLK. Since an input to a pull down network (PDN) must be maintained at '0' after an input of a clock signal CLK, it is difficult to adopt a domino gate to a digital design of a synthesis manner using the STA. Accordingly, a domino gate style circuit may follow a custom design manner. Circuit realization using the custom design manner may be limited considering the trend that a time taken to design circuits becomes shorter.

Another problem may arise due to the adoption of a keeper circuit. To improve the leakage and coupling, a keeper circuit may be realized by installing an inverter and a PMOS transistor at each of output terminals of cascade connected domino gates. If the keeper circuit is used, it is difficult to know an input timing of an input signal after an input of a clock signal. Thus, the domino gate may wait forever. The adoption of the keeper circuit may cause a fighting problem at an evaluation operation of a gate circuit. This means that an operating speed is decreased.

Still another problem may be related to an input noise. While a clock is activated, a noise included in an input signal may cause an abnormal operation of a circuit. This may be prevented by enlarging a size of the PMOS transistor. But, the enlarging of the PMOS transistor in size may decrease an operating speed.

With a dynamic gate of the exemplary embodiment, it is possible to solve the above-described problems of the domino gate.

Below, a second exemplary embodiment will be described with reference to FIG. 2.

Referring to FIG. 2, a digital logic circuit 150 may include an N-stage dynamic logic gate 50 and a pulse latch unit 140.

The N-stage dynamic logic gate 50 may include dynamic logic gates 10, 11, . . . , 14 which are cascade connected to logically gate the first to N input data sequentially in response to the first to Nth clock signals CLK to CLKN. The clock signal CLK1 to CLKN may be generated by delay part 20, 21 delaying the first clock CLK sequentially.

The pulse latch unit 140 may include a pulse latch 110 and a pulse generator 25. The pulse latch 110 may be configured to latch a gating output N0 of the N-stage dynamic logic gate 14 according to a pulse signal. The pulse generator 25 may be configured to generate the pulse signal by delaying the Nth clock signal CLKN.

The dynamic logic gate 10 placed at the first stage of the N-stage dynamic logic gate 50 may include a pre-charge transistor M0, a discharge transistor M1, and a pull-down network 10a.

The pre-charge transistor M0 may be a PMOS transistor which has a gate connected to receive the first clock signal CLK and a source terminal connected to a power supply (VDD) terminal.

The discharge transistor M1 may be an NMOS transistor which has a gate connected to receive the first clock signal CLK and a source grounded.

Like FIG. 1, the pull-down network 10a may be connected between a drain of the pre-charge transistor M0 and a drain of the discharge transistor M1 and receive a plurality of first input data INPUTS. If the pull-down network 10a performs a 3-input NAND gating operation, the pull down network 10a may be formed of three NMOS transistors whose channels are connected in series. If the pull-down network 10a performs a 3-input NOR gating operation, the pull down network 10a may be formed of three NMOS transistors whose channels are connected in parallel.

Figure 10:
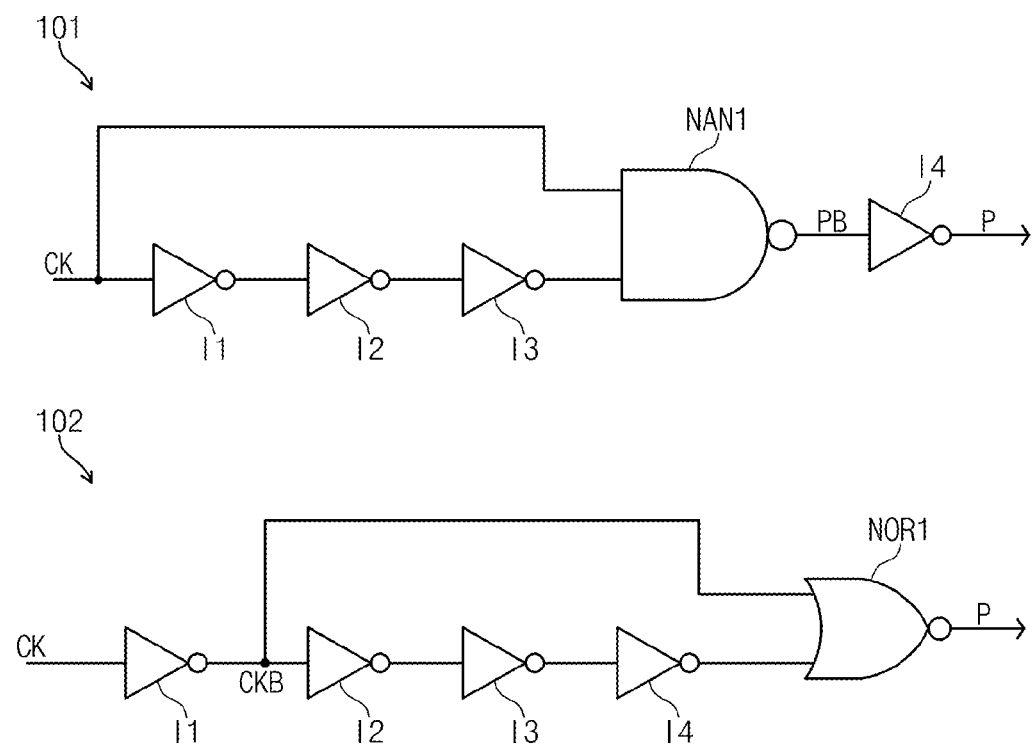
FIG. 10 is a circuit diagram of a pulse generator illustrated in FIGS. 5 and 7.

Like an operation of a dynamic logic gate 10 in FIG. 10, an operation of the dynamic logic gate 10 may include a charging operation and an execution operation.

A detailed circuit of the pulse latch 110 is illustrated in FIG. 3.

Referring to FIG. 3, the pulse latch 110 may include the first inverter I1 which receives a gating output of the dynamic logic gate 14 as an input signal IN and outputs an inverting response in response to the pulse signal P and an inverted pulse signal PB. The pulse latch 110 may further include the second inverter I2 and the third inverter I3. The second inverter I2 has an inverting output terminal connected to the output node OUT and operates in response to the pulse signal P and an inverted pulse signal PB. The third inverter I3 inverts the inverting response of the output node OUT to transfer the inverted result to an input of the second inverter I2.

Figure 4:
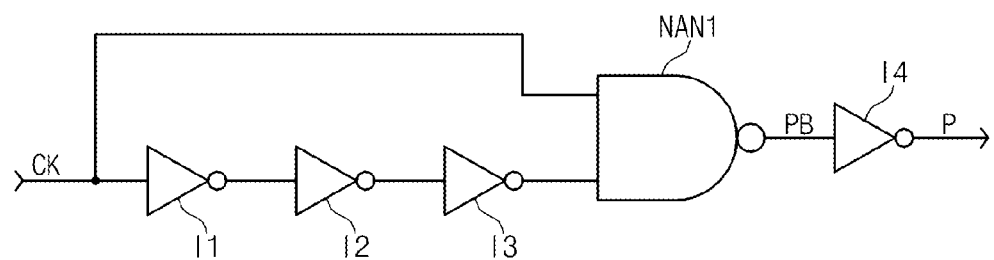
FIG. 4 shows a detailed circuit of a pulse generator in FIG. 4 according to an exemplary embodiment.

A detailed circuit of the pulse generator 25 is illustrated in FIG. 4.

Referring to FIG. 4, the pulse generator 25 may include inverters I1 to I4 and a NAND gate NAN1. A clock signal CK applied to the inverter I1 may substantially correspond to the Nth clock signal CLKN in FIG. 2. If the clock signal CK is at a low level, an output PB of the NAND gate NAN1 may have '1', and a pulse signal may have '0'. If the clock signal CK transitions to a high level, the output PB of the NAND gate NAN1 may have '0' for a predetermined time, and the pulse signal P may have '1'. Herein, the predetermined time may correspond to a total delay time of the inverters I1 to I3. As a result, the pulse generator 25 may output a high pulse signal during the predetermined time whenever the clock signal CK has a rising edge. The high pulse signal may have a characteristic which is not related to a duty of the clock signal CK.

The circuit in FIG. 2 may latch a gating output of the dynamic logic gate 14 using a pulse signal which is generated by gating a clock signal applied to the last stage of the dynamic logic gate 14 after the predetermined time elapses.

The pulse latch 110 may sample data during a pulse period. The pulse latch 110 may transfer an input signal to an output node OUT during a high period of a pulse signal and latch a logic value of the output node OUT regardless of a logic value of the input signal during a low period of the pulse signal.

As described above, since a digital logic circuit including a dynamic gate in FIG. 2 may adopt a pulse latch, together with merits of the circuit in FIG. 1, it may stably latch a final gating output according to a pulse signal regardless of a duty of a clock signal.

Below, various exemplary embodiments adopting a latching device will be described.

Figure 5:
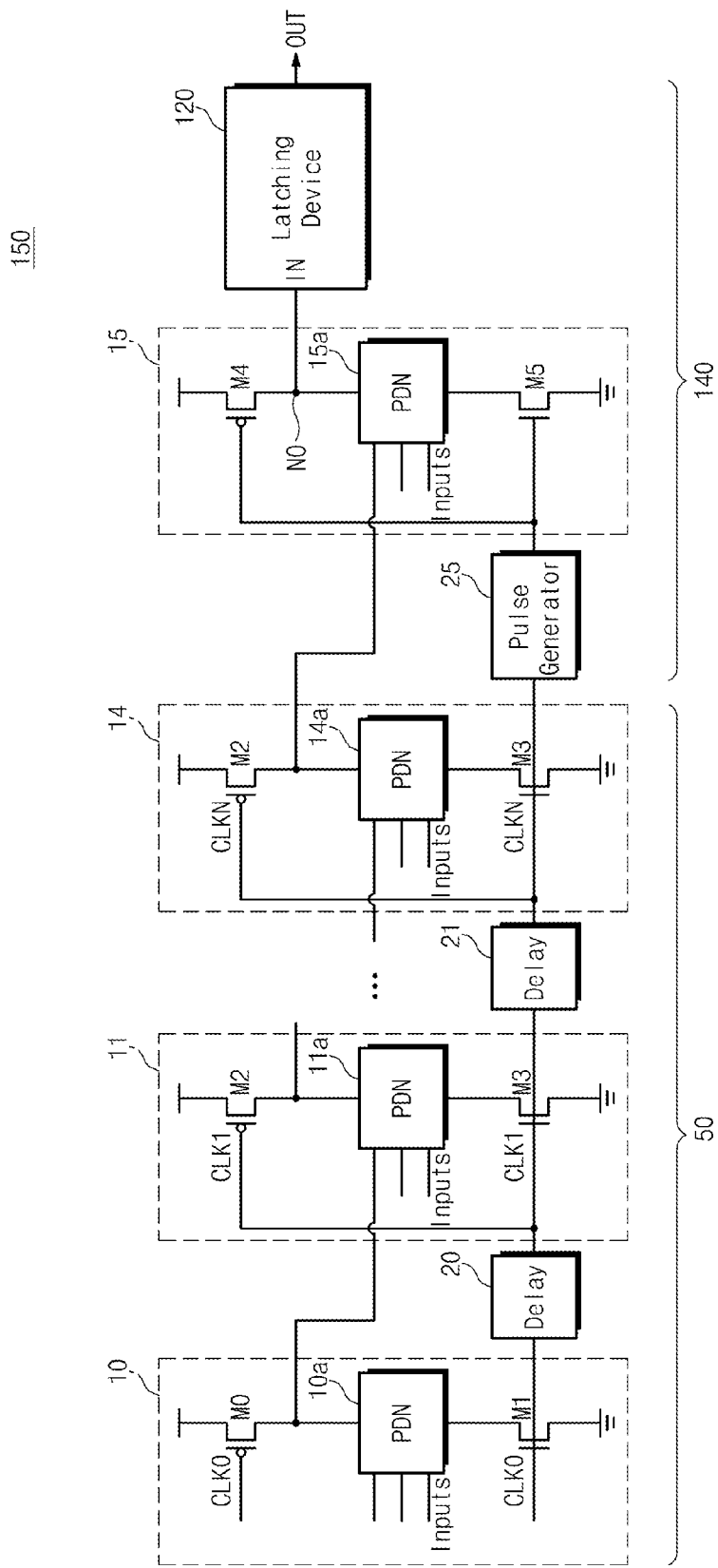
FIG. 5 is a block diagram of a digital logic circuit according to an exemplary embodiment.
Figure 6:
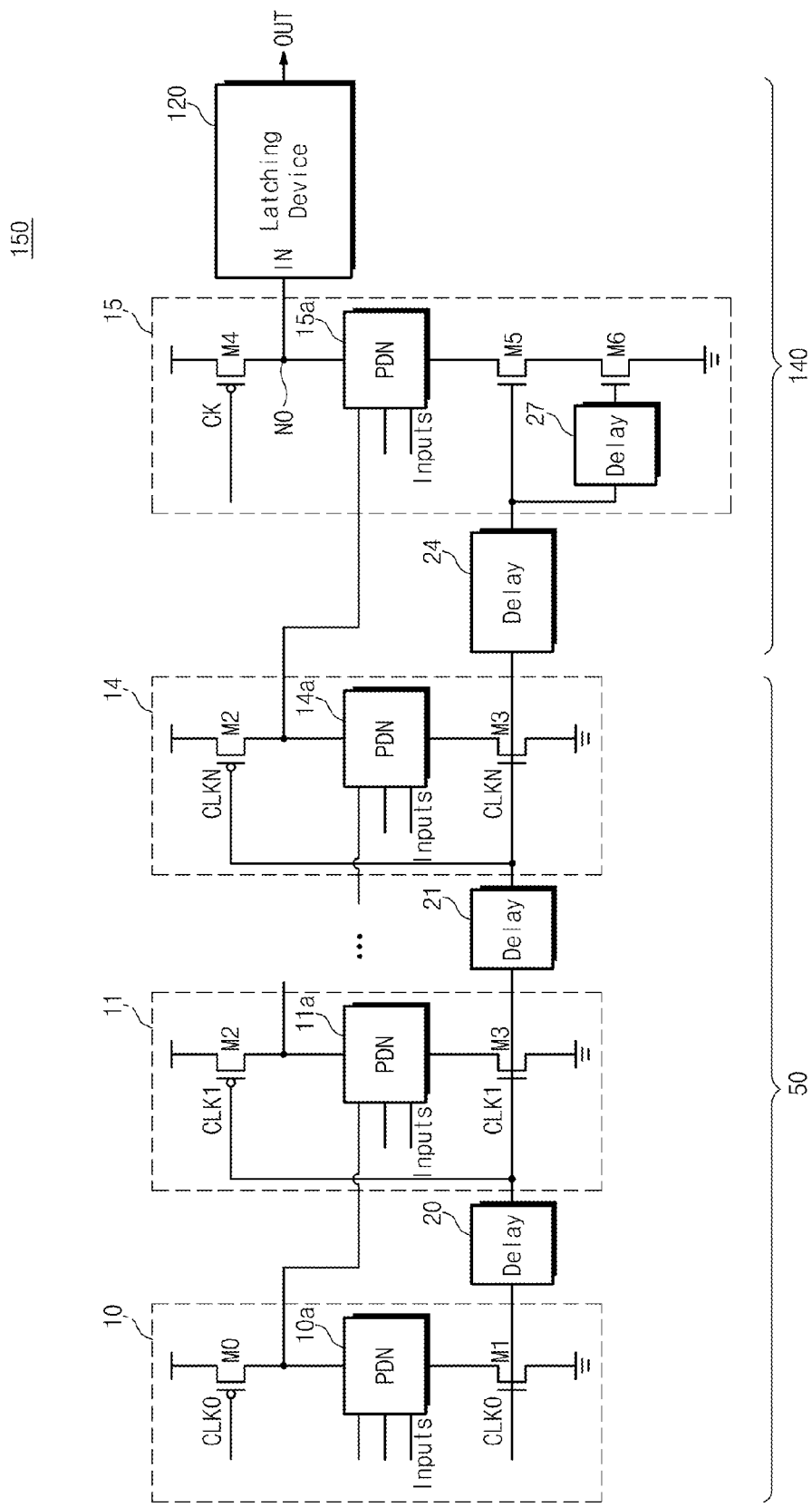
FIG. 6 is a block diagram of a digital logic circuit according to an exemplary embodiment.
Figure 7:
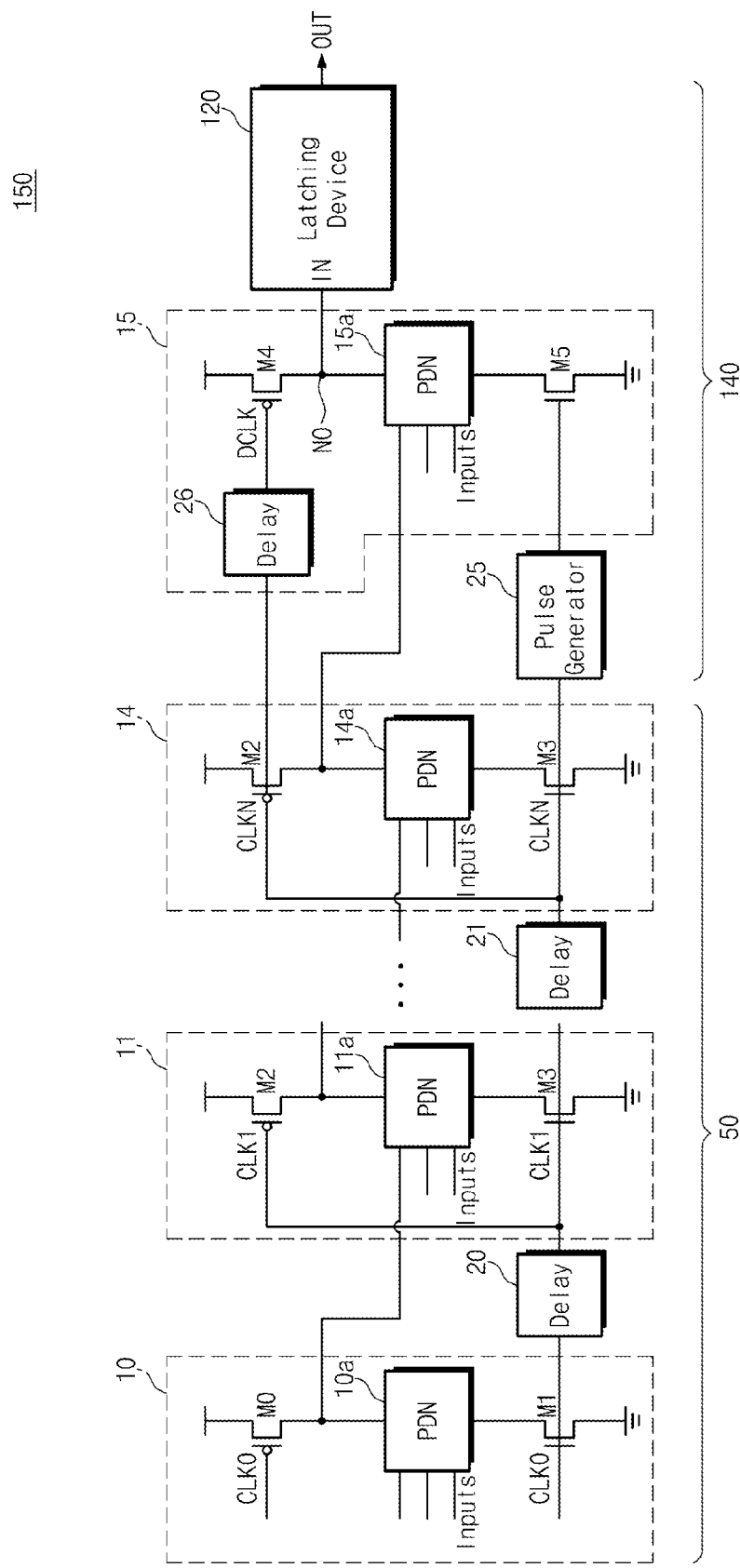
FIG. 7 is a block diagram of a digital logic circuit according to an exemplary embodiment.
Figure 8:
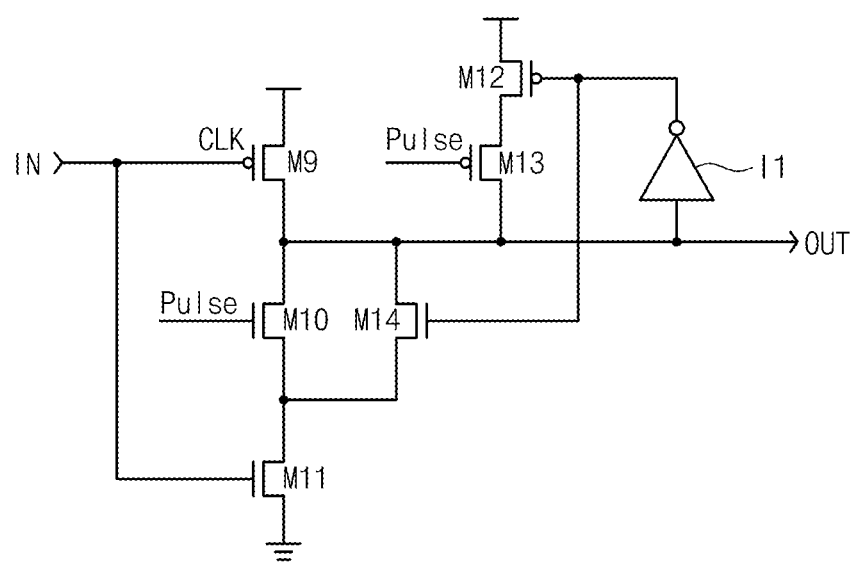
FIG. 8 is a circuit diagram of a latching device illustrated in FIG. 5.
Figure 9:
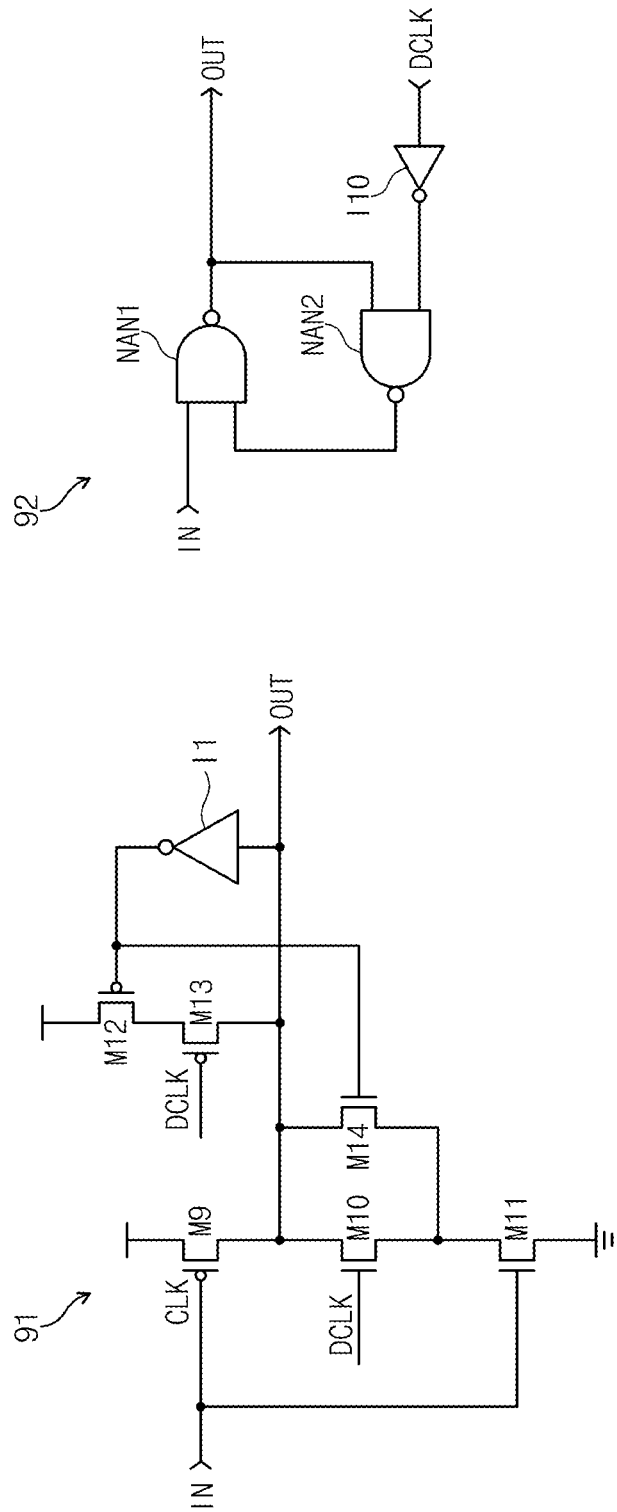
FIG. 9 is a circuit diagram of a latching device illustrated in FIGS. 6 and 7.

FIG. 5 is a block diagram of a digital logic circuit according to an exemplary embodiment, FIG. 6 is a block diagram of a digital logic circuit according to an exemplary embodiment, and FIG. 7 is a block diagram of a digital logic circuit according to an exemplary embodiment. FIG. 8 is a circuit diagram of a latching device illustrated in FIG. 5, FIG. 9 is a circuit diagram of a latching device illustrated in FIGS. 6 and 7, and FIG. 10 is a circuit diagram of a pulse generator illustrated in FIGS. 5 and 7.

Referring to FIG. 5, a digital logic circuit 150 may include an N-stage dynamic logic gate 50 and an output latch unit 140.

The N-stage dynamic logic gate 50 may include dynamic logic gates 10, 11, . . . , 14 which are cascade connected to logically gate the first to N input data sequentially in response to the first to Nth clock signals CLK to CLKN. The clock signal CLK1 to CLKN may be generated by delay part 20, 21 delaying the first clock CLK sequentially.

The output latch unit 140 may include the second dynamic logic gate 15 and a pulse signal generator 25. The second dynamic logic gate 15 may be configured to logically gate a gating output of the Nth dynamic logic gate and a plurality of Nth input data in response to the first pulse signal. The pulse signal generator 25 may be configured to generate the first pulse signal in response to the Nth clock signal CLKN.

Similarly, the dynamic logic gate 10 placed at the first stage of the N-stage dynamic logic gate 50 may include a pre-charge transistor M0, a discharge transistor M1, and a pull-down network 10a.

The pre-charge transistor M0 may be a PMOS transistor which has a gate connected to receive the first clock signal CLK and a source connected to a power supply (VDD) terminal.

The discharge transistor M1 may be an NMOS transistor which has a gate connected to receive the first clock signal CLK and a source grounded.

The pull-down network 10a may be connected between a drain of the pre-charge transistor M0 and a drain of the discharge transistor M1 and receive a plurality of first input data INPUTS. If the pull-down network 10a performs a 4-input NAND gating operation, the pull-down network 10a may be formed of four NMOS transistors whose channels are connected in series. If the pull-down network 10a carries out a 4-input NOR gating operation, the pull-down network 10a may be formed of four NMOS transistors whose channels are connected in parallel.

The second dynamic logic gate 15 may include a pre-charge transistor M4, a discharge transistor M5, and a pull-down network 15a.

The pre-charge transistor M4 may be a PMOS transistor which has a gate connected to receive the first pulse signal and a source connected to a power supply (VDD) terminal.

The discharge transistor M5 may be an NMOS transistor which has a gate connected to receive the first pulse signal and a source grounded.

The pull-down network 15a may be connected between a drain of the pre-charge transistor M4 and a drain of the discharge transistor M5 and receive a gating output of the Nth dynamic logic gate 14 and a plurality of (N+1)th input data INPUTS. Herein, N is an integer of 2 or more.

The latching device 120 may be formed of a latch circuit illustrated in FIG. 8.

The pulse signal generator 25 may be formed of a pulse signal generator illustrated in FIG. 10.

The circuit in FIG. 5 may have merits similar to that in FIG. 2 since the second dynamic logic gate 15 formed within the output latch unit 140 uses a single pulse. That is, it is possible to stably latch a final gating output according to a pulse signal regardless of a duty of a clock signal.

Referring to FIG. 6, a digital logic circuit may include an N-stage dynamic logic gate 50 and an output latch unit 140. Herein, the N-stage dynamic logic gate 50 may be identical to that in FIG. 5.

The output latch unit 140 may include the second dynamic logic gate 15, a latching device 120, and a delay signal generating unit 24 and 27. The second dynamic logic gate 15 may be configured to logically gate a gating output of the Nth dynamic logic gate 14 and a plurality of (N+1)th input data in response to a clock signal and the first and second delay signals. The latching device 120 may be configured to latch a gating output of the second dynamic logic gate 15. The delay signal generating unit 24 and 27 may be configured to generate the first and second delay signals in response to the Nth clock signal CLKN. The delay signal generating unit 24 and 27 may operate similarly with a pulse generator.

The second dynamic logic gate 15 may include a pre-charge transistor M4, a sub-discharge transistor M5, a discharge transistor M6, and a pull-down network 15a.

The pre-charge transistor M4 may be a PMOS transistor which has a gate connected to receive a clock signal CK and a source connected to a power supply (VDD) terminal.

The sub-discharge transistor M5 and the discharge transistor M6 may be NMOS transistors having gates receiving the first and second delay signals, respectively.

The pull-down network 15a may be connected between a drain of the pre-charge transistor M4 and a drain of the sub-discharge transistor M5 and receive a gating output of the Nth dynamic logic gate 14 and a plurality of (N+1)th input data INPUTS. Herein, N may be an integer of 2 or more.

The latching device 120 may be formed of a latch circuit illustrated in FIG. 8.

The circuit in FIG. 6 may be configured such that the second dynamic logic gate 15 within the output latch unit 140 uses delayed clock signals.

Unlike a dynamic logic circuit in FIG. 5 using a single pulse signal, the second dynamic logic gate 15 in FIG. 7 may use a delay clock signal of delay 26 and a pulse signal of pulse generator 25. Accordingly, a charging operation of the second dynamic logic gate 15 may be based on the delay clock signal DCLK, and an execution operation thereof may be based on the pulse signal.

Accordingly, a pull-down transistor of the second dynamic logic gate in FIG. 7 may not be affected by a duty of a clock signal at the execution operation.

A circuit in FIG. 8 may be used as a latching device 120 in FIG. 5.

Referring to FIG. 8, the latching device 120 may include NMOS and PMOS transistors M10 and M13 receiving a pulse signal, a plurality of NMOS transistors M11 and M14, a plurality of PMOS transistors M9 and M12, and an inverter I1.

A circuit in FIG. 9 may be used as a latching device 120 in FIG. 6 or 7.

Referring to FIG. 9, reference numerals 91 and 92 may represent different types of latching devices, respectively. The latching devices 91 and 92 may operate responsive to a clock signal, not a pulse signal. The latching device represented by the reference numeral 91 may include a plurality of NMOS transistors M10, M11 and M14, a plurality of PMOS transistors M9, M12 and M13, and an inverter I1.

The latching device represented by the reference numeral 92 may include NAND gates NAN1 and NAN2 and an inverter 110.

As illustrated in FIGS. 8 and 9, a latching device according to an exemplary embodiment may maintain a logic level of an output node OUT during a low period of a delayed clock or a pulse signal. Accordingly, a circuit configured to have the above-described function may be applied to all latching devices.

A pulse generating circuit in FIG. 10 may be used as a pulse generator 25 in FIG. 5 or 7.

Referring to FIG. 10, a pulse generator 101 may include inverters I1 to I4 and a NAND gate NAN1. A clock signal CK applied to the inverter I1 may substantially correspond to the Nth clock signal CLKN in FIG. 5. In FIG. 10, when the clock signal CK is at a low level, an output of the NAND gate NAN1 may have '1', and a pulse signal P may have '0'. If the clock signal CK goes high, the output of the NAND gate NAN1 may maintains '1' during a predetermined time, and the pulse signal P may have '1'. Herein, the predetermined time may correspond to a total delay time of the inverters I1 to I3. As a result, the pulse generator 101 may output a high pulse signal having a predetermined period whenever a clock signal has a rising edge. Herein, the high pulse signal may not be based on a duty of the clock signal.

A pulse generator 102 may include inverters I1 to I4 and a NOR gate NOR1. When the clock signal CK has a low-to-high transition, an output of the NOR gate NOR1 may have '1' only during a predetermined time. Herein, the predetermined time may correspond to a total delay time of the inverters I2 to I4. As a result, the pulse generator 102 may output a high pulse signal having a predetermined period whenever a clock signal has a rising edge. Likewise, the high pulse signal may not be based on a duty of the clock signal.

Modified embodiments according to exemplary embodiments will be described with reference to FIGS. 11 to 13.

Figure 11:
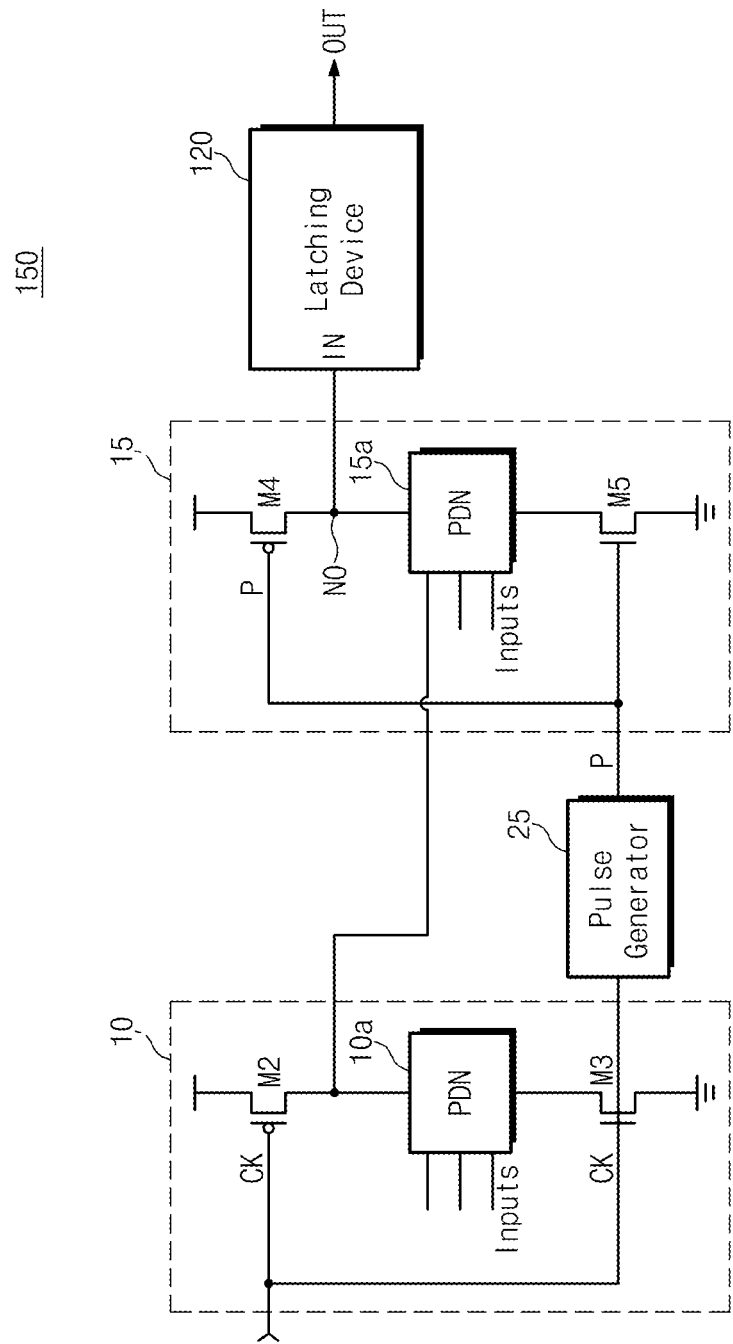
FIG. 11 is a circuit diagram of a digital logic circuit according to a modified exemplary embodiment of FIG. 5.
Figure 12:
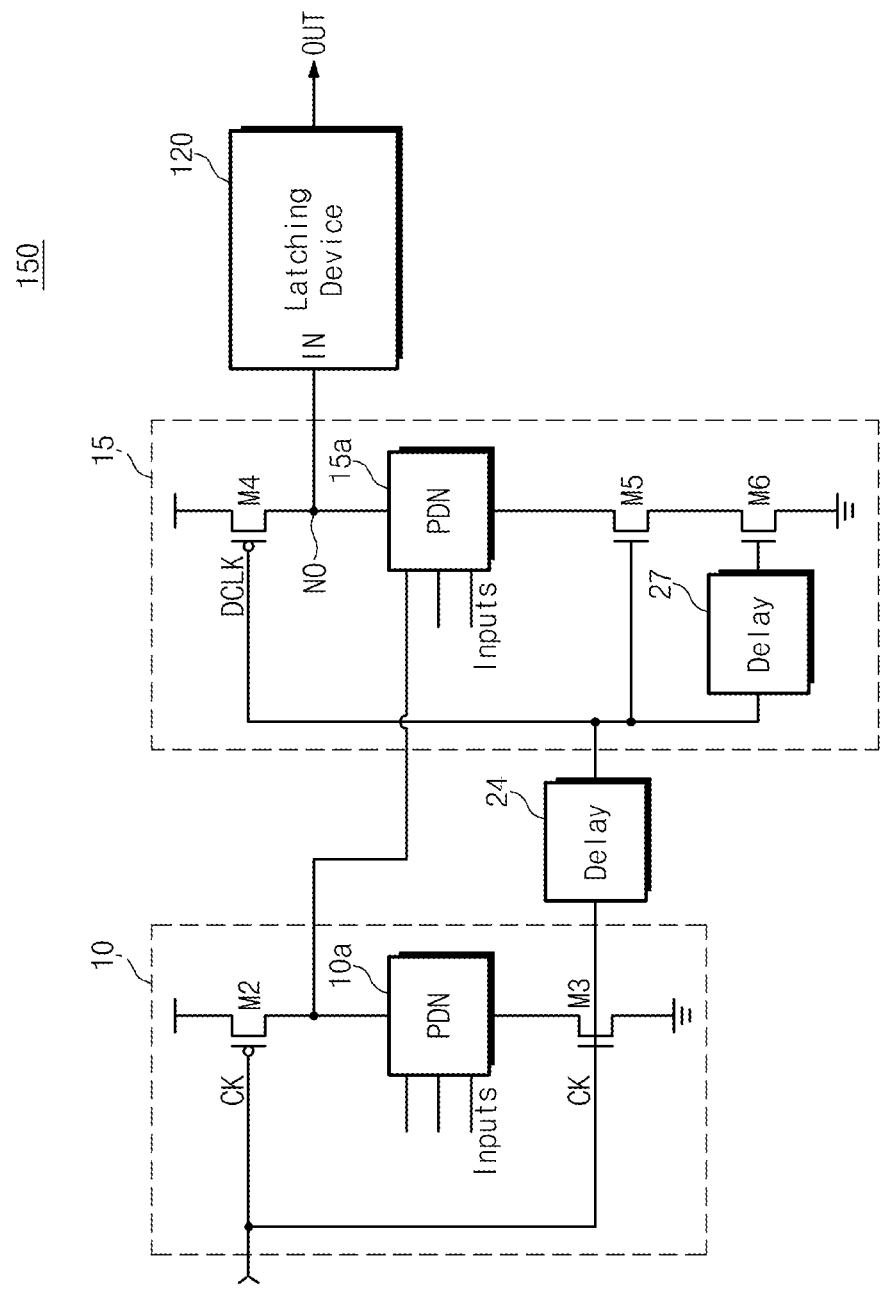
FIG. 12 is a circuit diagram of a digital logic circuit according to a modified exemplary embodiment of FIG. 6.
Figure 13:
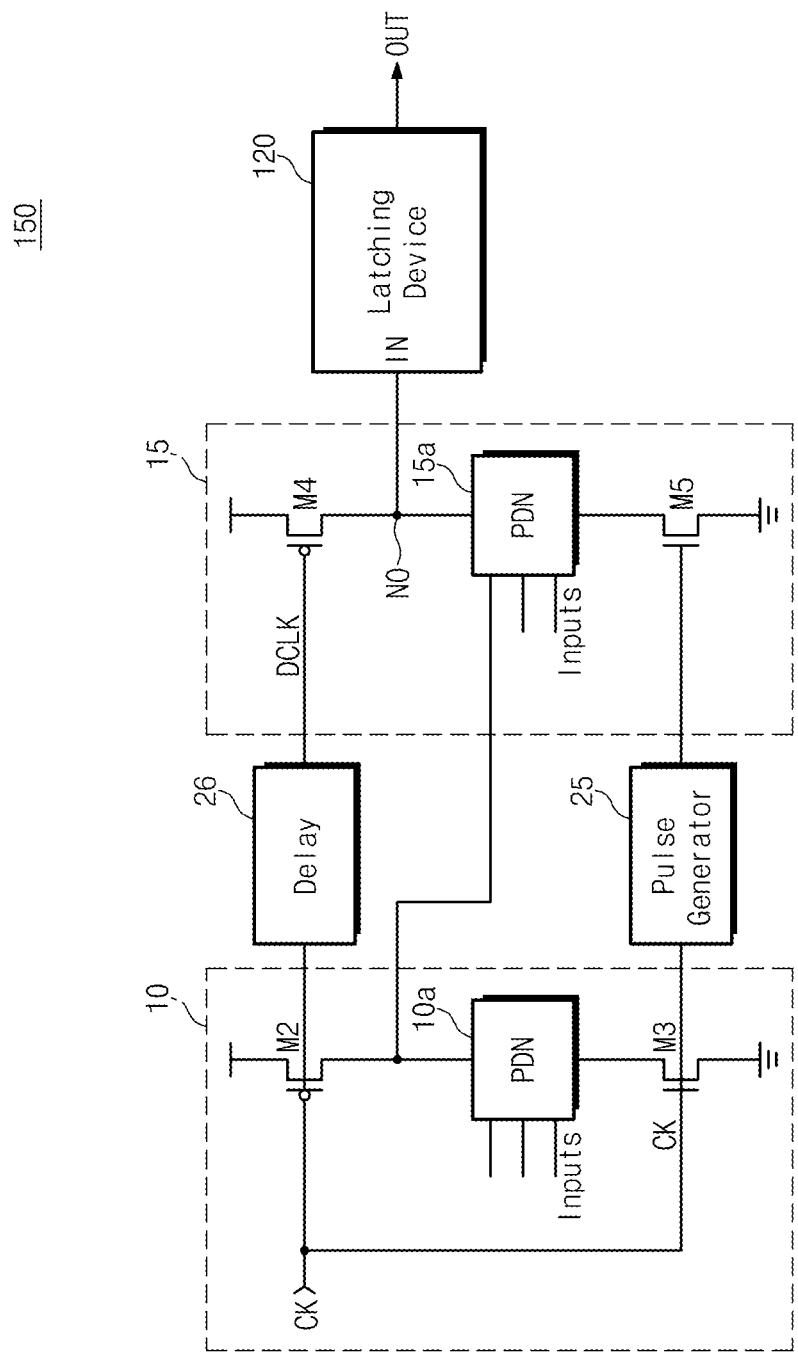
FIG. 13 is a circuit diagram of a digital logic circuit according to a modified exemplary embodiment of FIG. 7.

FIG. 11 is a circuit diagram of a digital logic circuit according to a modified exemplary embodiment of FIG. 5, FIG. 12 is a circuit diagram of a digital logic circuit according to a modified exemplary embodiment of FIG. 6, and FIG. 13 is a circuit diagram of a digital logic circuit according to a modified exemplary embodiment of FIG. 7.

Referring to FIG. 11, the first dynamic logic gate 10 corresponding to the first stage of an N-stage dynamic logic gate 50 in FIG. 5 may be placed at a front stage of the second dynamic logic gate 15 of an output latch unit 140 in FIG. 5.

A digital logic circuit in FIG. 11 may include the first dynamic logic gate 10 which is configured to logically gate a plurality of first input data INPUTS. The digital logic circuit may further include the second dynamic logic gate 15, a latching device 120, a pulse signal generating unit 25. The second dynamic logic gate 15 may be configured to logically gate a gating output of the first dynamic logic gate 10 and a plurality of second input data INPUTS. The latching device 120 may be configured to latch a gating output of the second dynamic logic gate 15. The pulse signal generating unit 25 may be configured to generate the first pulse signal P in response to the first clock signal CK.

The second dynamic logic gate 15, the latching device 120, and the pulse signal generating unit 25 may be included in an output latch unit 140 in FIG. 5.

The first dynamic logic gate 10 may include a pre-charge transistor M2 having a gate connected to the first clock signal CK and a source connected to a power supply (VDD) terminal, a discharge transistor M3 having a gate connected to the first clock signal CK and a source grounded, and a pull-down network 10a connected between a drain of the pre-charge transistor M2 and a drain of the discharge transistor M3 and receiving the plurality of first input data INPUTS.

The second dynamic logic gate 15 may include a pre-charge transistor M4 having a gate connected to the first pulse signal P and a source connected to the power supply (VDD) terminal, a discharge transistor M5 having a gate connected to the first pulse signal P and a source grounded, and a pull-down network 15a connected between a drain of the pre-charge transistor M4 and a drain of the discharge transistor M5 and receiving a plurality of second input data INPUTS.

With the circuit structure in FIG. 11, the pre-charge and discharge transistors M4 and M5 of the second dynamic logic gate 15 and the latching device 120 may operate responsive to a single pulse provided from the pulse generator 25.

Referring to FIG. 12, the first dynamic logic gate 10 corresponding to the first stage of an N-stage dynamic logic gate 50 in FIG. 6 may be installed at a front stage of the second dynamic logic gate 15 in an output latch unit 140 in FIG. 6.

The digital logic circuit in FIG. 12 may include the first dynamic logic gate 10 configured to logically gate a plurality of first input data INPUTS in response to the first clock signal CK; the second dynamic logic gate 15; a latching device 120 configured to latch a gating output of the second dynamic logic gate 15; and a delay signal generating unit 24 and 27 configured to generate the first and second delay signals using the first clock signal CK.

The second dynamic logic gate 15 may include a pre-charge transistor M4, a sub-discharge transistor M5, a discharge transistor M6, and a pull-down network 15a.

The pre-charge transistor M4 may be a PMOS transistor which has a gate connected to receive the first delay signal and a source connected with a power supply (VDD) terminal.

The sub-discharge transistor M5 may be an NMOS transistor having a gate receiving the first delay signal, and the discharge transistor M6 may be an NMOS transistor having a gate receiving the second delay signal.

The pull-down network 15a may be connected between a drain of the pre-charge transistor M4 and a drain of the sub-discharge transistor M5 and configured to receive a gating output of the first dynamic logic gate 10 and a plurality of second input data INPUTS.

The latching device 120 may be formed of a latch circuit illustrated in FIG. 9.

With the circuit in FIG. 12, the second dynamic logic gate 15 and the latching device 120 may perform a logic gating operation and a data latch operation using a clock signal delayed by a delay element, respectively.

Referring to FIG. 13 showing a simplified circuit of FIG. 7, a digital logic circuit may include the first and second dynamic logic gates 10 and 15, a latching device 120, a pulse signal generating unit 25, and delay 26. Delay unit 26 may generate a delay clock signal DCLK by delaying the first clock signal CK. But, the delay clock signal DCLK may be a type of pulse signal. Therefore, the delay unit 26 may be included in the pulse signal generating unit together with the pulse generator 25.

The first dynamic logic gate 10 may include a pre-charge transistor M2 having a gate connected to receive the first clock signal CK and a source connected with a power supply terminal; a discharge transistor M3 having a gate connected to receive the first clock signal CK and a source grounded; and a pull-down network 10a connected between a drain of the pre-charge transistor M2 and a drain of the discharge transistor M3 and receiving the plurality of first input data INPUTS.

The second dynamic logic gate 15 may include a pre-charge transistor M4 having a gate connected to receive the first pulse signal DCLK and a source connected with a power supply terminal; a discharge transistor M5 having a gate connected to receive the second pulse signal P and a source grounded; and a pull-down network 15*a* connected between a drain of the pre-charge transistor M4 and a drain of the discharge transistor M5 and receiving the plurality of second input data INPUTS.

A latching device 120 may be configured to latch a gating output on an output node N0 of the second dynamic logic gate 15 according to the first pulse signal DCLK and formed of a latch circuit in FIG. 9.

The pulse signal generating unit may include a delay unit 26 and a pulse generator 25. The delay unit 26 may be configured to generate the first pulse signal DCLK by delaying the first clock signal CK. The pulse generator 25 may be configured to generate the second pulse signal by delaying and gating the first clock signal CK.

In accordance with the circuit structure in FIG. 13, the discharge transistor M5 of the second dynamic logic gate 15 may operate responsive to a pulse signal provided from the pulse generator 25, and the pre-charge transistor M4 and the latching device 120 may operate responsive to a delay signal (i.e., the first pulse signal) provided from the delay unit 26.

Figure 14:
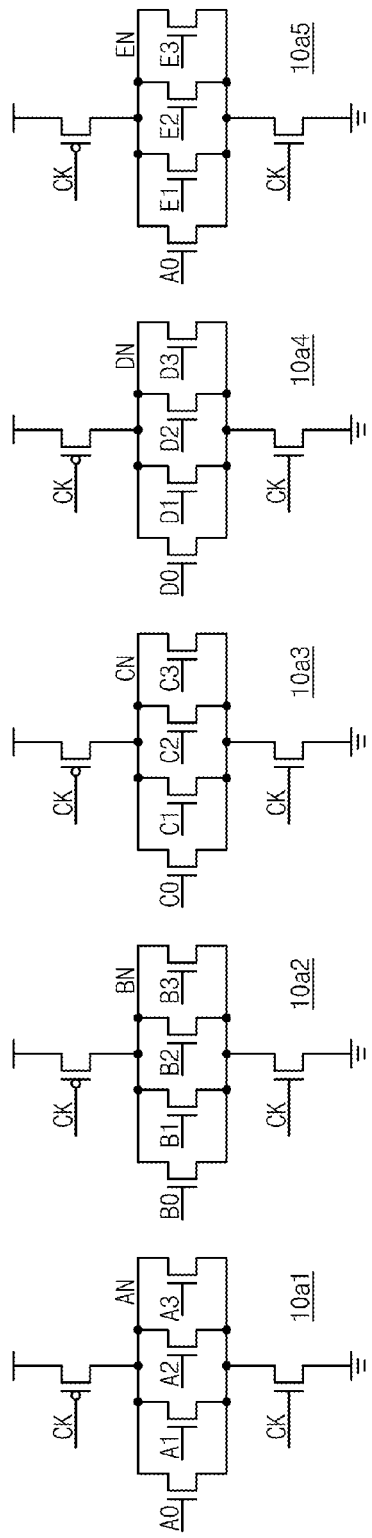
FIG. 14 shows exemplary embodiments of FIG. 13.
Figure 14:
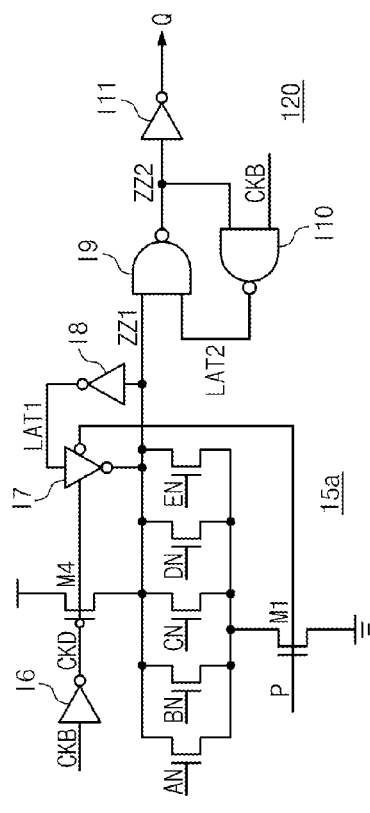
Figure 14:
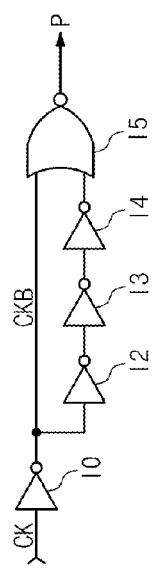

FIG. 14 shows exemplary embodiments of FIG. 13. Circuit elements represented by reference numerals 10*a*1 to 10*a*5 may correspond to the first dynamic logic gate 10 in FIG. 13, a circuit element represented by a reference numeral 15*a* may correspond to the second dynamic logic gate 15 in FIG. 13. A circuit element represented by a reference numeral 120 may correspond to a latching device 120 in FIG. 3. A pulse generator 25 in FIG. 13 may be represented by a circuit element outputting a pulse signal P and placed at the lowermost part of FIG. 14.

The circuit elements 10*a*1 to 10*a*5 may perform a 4-input NOR operation, respectively. Results AN, BN, CN, DN and EN of the 4-input NOR operations may be provided as input data of the second dynamic logic gate 15*a*.

The second dynamic logic gate 15*a* may conduct the 4-input NOR operation of the gating outputs AN, BN, CN, DN and EN.

The pre-charge transistor M4 of the second dynamic logic gate 15*a* may be controlled according to a logic state of a clock signal CKD delayed by inverting a clock bar signal CKB. The discharge transistor M1 may be controlled according to a high or low logic state of a pulse signal P.

A latching device 120 may latch data of a gating output node ZZ1 according to a logic state of the clock bar signal CKB and output the latched data to an output node Q. A latch LAT1 formed of inverters I7 and I8 may be provided at the output node Q.

As a result, a circuit in FIG. 14 may be equivalent to a D flip-flop including a "OA4444" gate. That is, the circuit in FIG. 14 may be a flip-flop which performs the following operation.

$$(A0+A1+A2+A3)*(B0+B1+B2+B3)*(C0+C1+C2+C3)*(D0+D1+D2+D3)*(E0+E1+E2+E3)$$

Accordingly, the circuit may be suitable for a wide fan-in as compared with a circuit design using a static gate. It is possible to realize a fast evaluation operation through a dynamic logic gate. Further, it is possible to effectively design a logic circuit. It may be suitable for general use by expanding an AND/OR operation without limitation.

Figure 15:
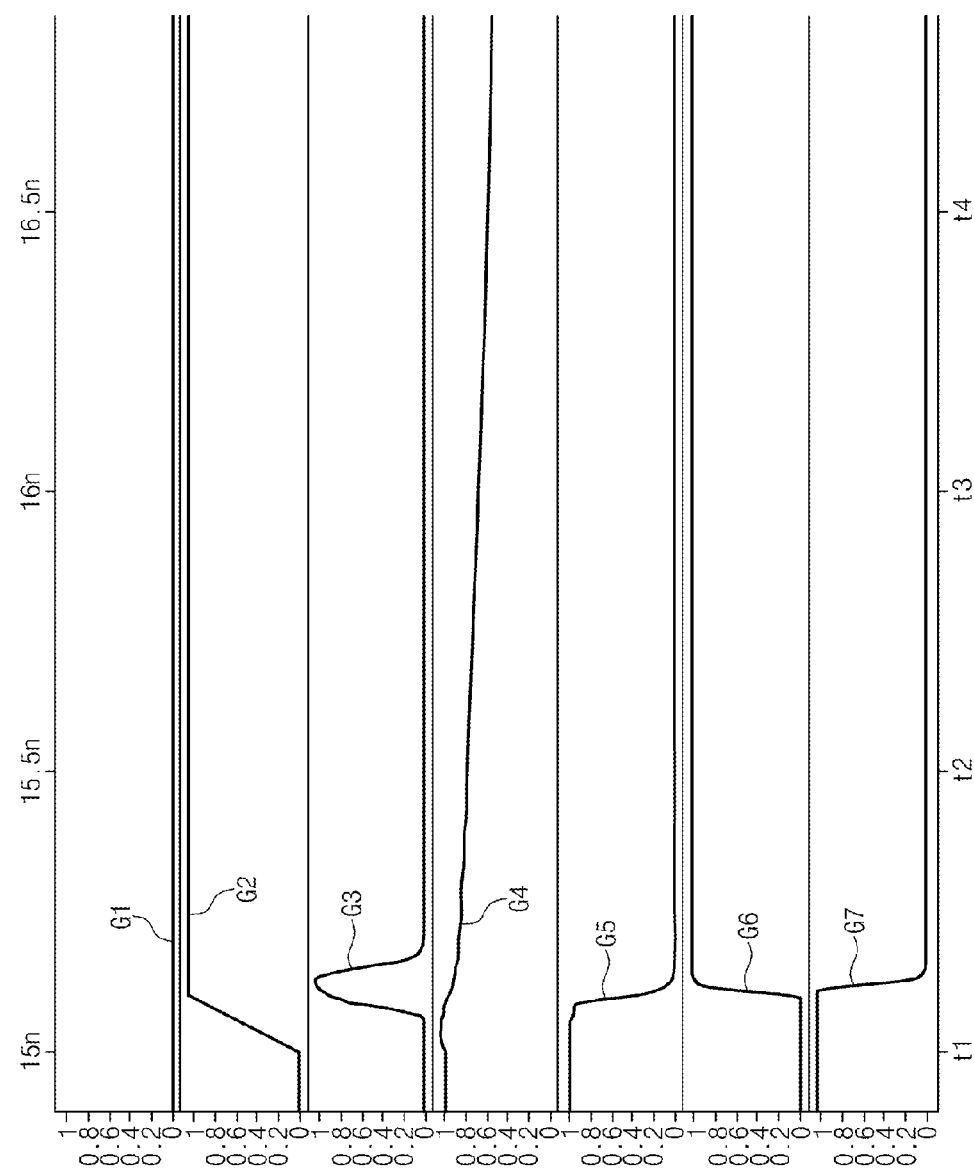
FIGS. 15 and 16 are simulation waveform diagrams showing a result of a gating operation of FIG. 14.
Figure 16:
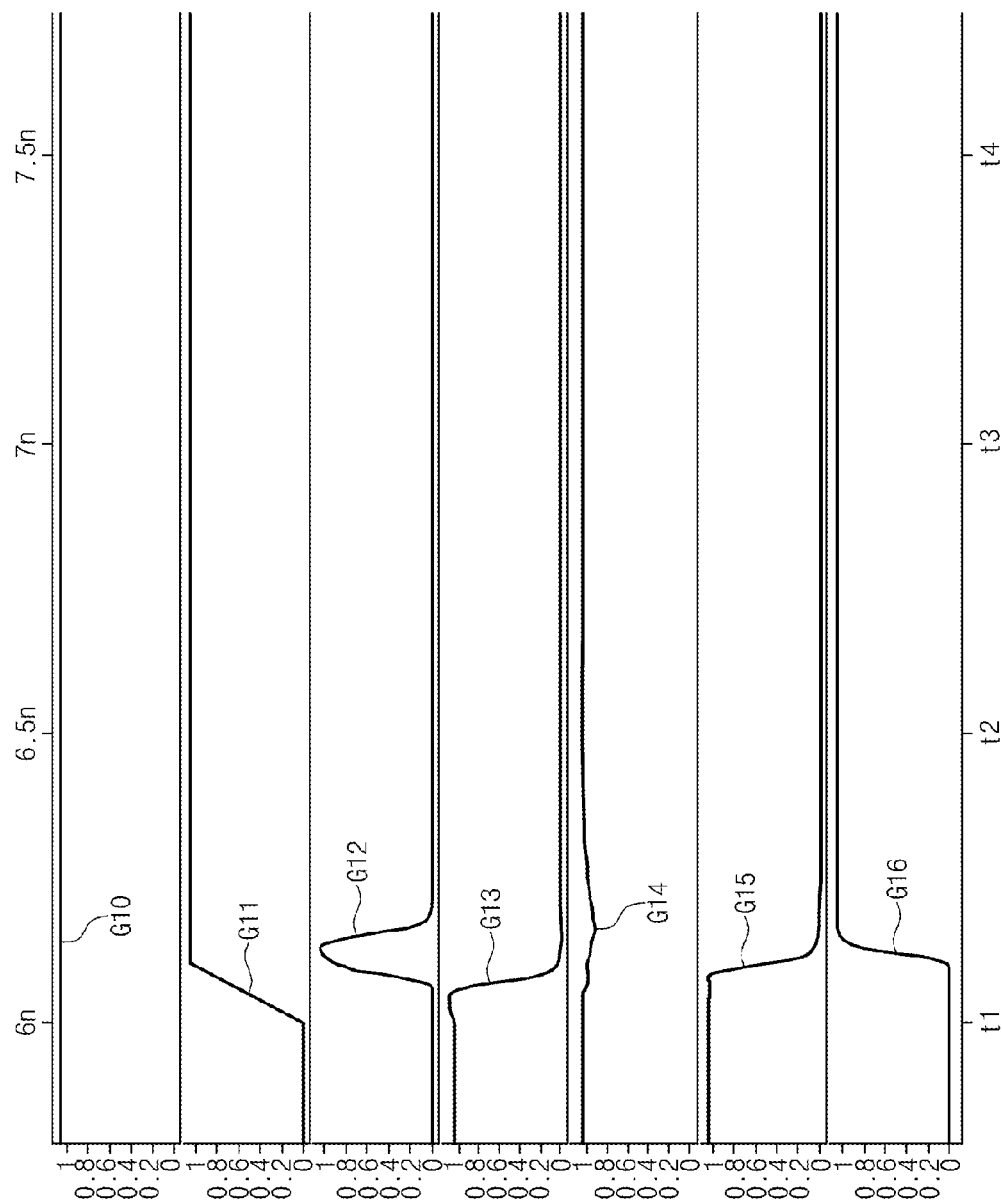

FIGS. 15 and 16 are simulation waveform diagrams showing a result of a gating operation of FIG. 14. In FIGS. 15 and 16, a horizontal axis may represent a time (ns), and a vertical axis may represent a voltage (V).

Waveform graphs G1 to G7 in FIG. 15 may show that an output node Q of FIG. 14 is set to '0' when data of A0 is '0'. In this case, a logic high level may be applied to inputs B0, C0, D0 and E0, and a logic low level may be applied to inputs B1, B2, B3, C1, C2, C3, D1, D2, D3, E1, E2, and E3. At this condition, a low level may be applied as an input of A0. In FIG. 15, the waveform graph G1 may represent that A0=0, and the waveform graph G2 may represent a clock signal CK in FIG. 14. The waveform graph G3 may represent a pulse signal P in FIG. 14, and the waveform graph G4 may represent an output AN of 10*a*1 in FIG. 14. The waveform graphs G5 and G6 may represent nodes ZZ1 and ZZ2 in FIG. 14, respectively. The waveform graph G7 may represent an output Q in FIG. 14.

In case of A0=0, an AN signal may lower increasingly due to a leakage as represented by the waveform graph G4. But, since a data capturing operation is previously ended by a pulse at a time of 15.15 ns after a time t1, a circuit may not be affected in operation. That is, it is possible to obtain a good gating output rapidly without a keeper circuit.

Meanwhile, waveforms graphs G10 to G16 in FIG. 16 may show that an output node Q in FIG. 14 is set to '1' when data A0 is '1'. In this case, a logic high level may be applied to inputs B0, C0, D0 and E0 in FIG. 14, and a logic low level may be applied to inputs B1, B2, B3, C1, C2, C3, D1, D2, D3, E1, E2, and E3 in FIG. 14. In this condition, a logic high level may be applied as an input A0.

In FIG. 16, the waveform graph G10 may represent that A0=1, and the waveform graph G11 may represent a clock signal CK in FIG. 14. The waveform graph G12 may represent a pulse signal P in FIG. 14, and the waveform graph G13 may represent an output AN of 10*a*1 in FIG. 14. The waveform graphs G5 and G6 may represent nodes ZZ1 and ZZ2 in FIG. 14, respectively. It is understood that a gating response of an output Q is provided in a high speed when A0=1.

Figure 17:
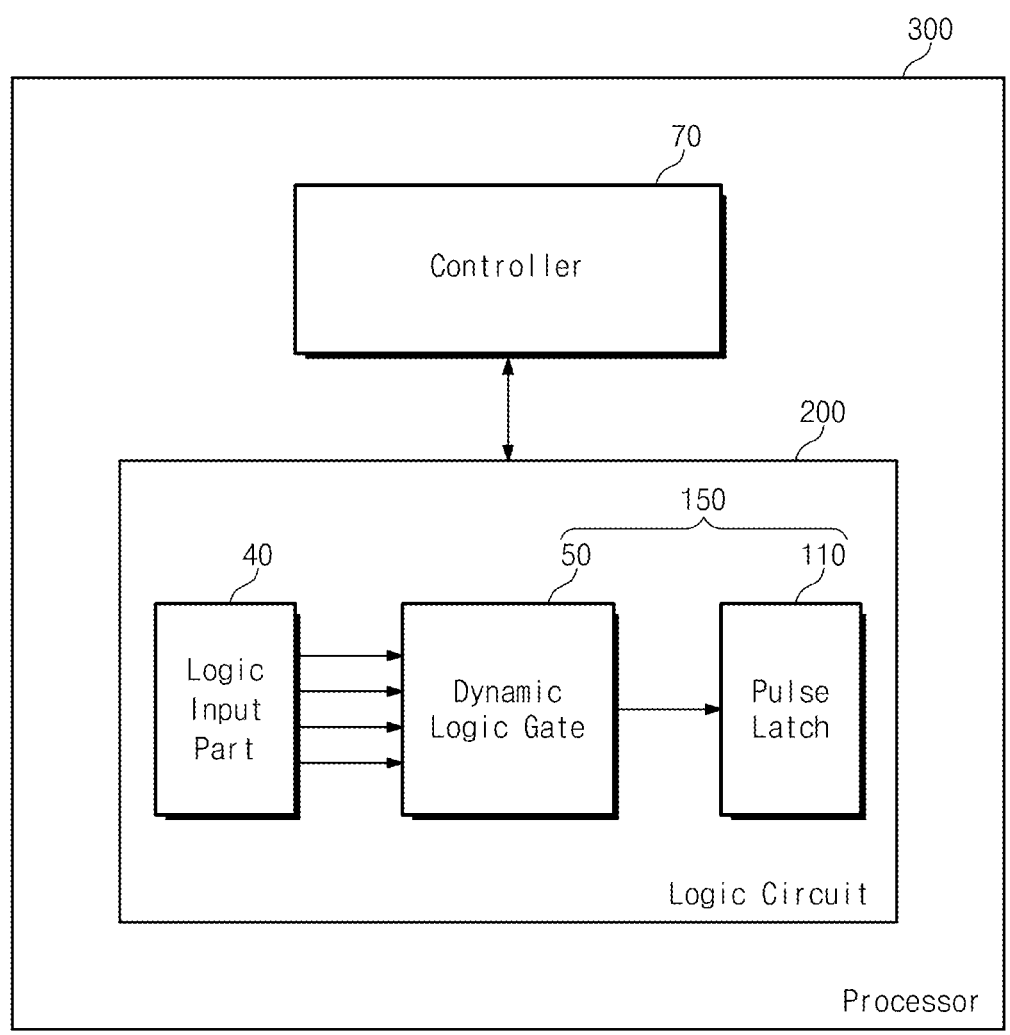
FIG. 17 is a block diagram of a processor including a digital logic circuit according to an exemplary embodiment.
Figure 18:
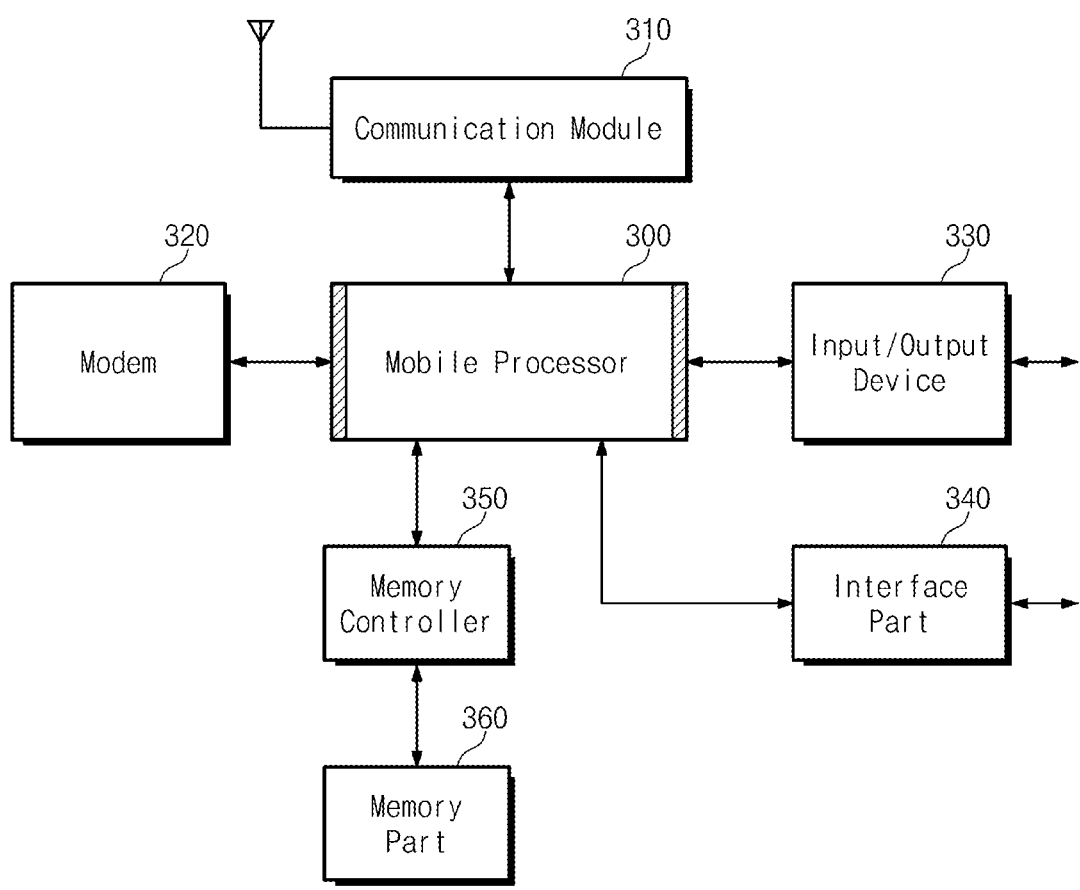
FIG. 18 is a block diagram of a mobile device including a digital logic circuit according to an exemplary embodiment.

FIG. 17 is a block diagram of a processor including a digital logic circuit according to an exemplary embodiment, and FIG. 18 is a block diagram of a mobile device including a digital logic circuit according to an exemplary embodiment.

Referring to FIG. 17, a processor (or, CPU) 300 may include a controller 70 and a logic circuit 200. The logic circuit 200 may include a logic input unit 40, a dynamic logic gate 50, and a pulse latch 110. Herein, the dynamic logic gate 50 and the pulse latch 110 may constitute a digital logic circuit 150 according to the exemplary embodiments. Accordingly, as described above, the dynamic logic gate of the digital logic circuit 150 does not include a keeper circuit, so that a gate delay is reduced. In other words, the digital logic circuit 150 may perform a high-speed gating operation and have a relatively robust characteristic against a leakage or an input noise. This means that the performance of the processor (or, CPU) 300 may be improved.

A mobile device in FIG. 18 may include a mobile processor 300, which is configured to have the same block structure as illustrated in FIG. 17.

The mobile device may include a communication modem 310, a modem 320, an input/output device 330, an interface part 340, a memory controller 350, and a memory part 350.

Herein, the mobile device may be one of a smart phone, a cellular phone, a PDA digital camera, a portable game machine, a notebook computer, and the like. Although not shown in FIG. 18, the mobile device may include a battery for supplying an operating voltage needed for a device and a power supply device for using a power more effectively. The mobile device may further include an application chipset, a camera image processor (CIS).

A memory system including the memory controller 350 and the memory part 360 may constitute a solid state drive/disk (SSD) which uses a non-volatile memory to store data. Alternatively, the memory system may constitute a fusion flash memory (including an SRAM buffer, a NAND flash memory, NOR interface logic, and the like).

A memory system or a mobile processor 300 may be mounted within a mobile device using various packages, eg., PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flatpack), SOIC (Small Outline Integrated Circuit), SSOP (Shrink Small Outline Package), TSOP (Thin Small Outline Package), TQFP (Thin Quad Flatpack), SIP (System In Package), MCP (Multi Chip Package), WFP (Wafer-level Fabricated Package), WSP (Wafer-Level Processed Stack Package), and the like.

In FIG. 18, if a digital logic circuit according to the exemplary embodiments is adopted for a gating operation of a mobile processor 300, the performance of a mobile device may be improved, and a power saving capacity of a processor may be improved.

In accordance with the exemplary embodiments, it is possible to reduce a gate delay without adopting adoption of a keeper circuit to a dynamic logic gate. Further, a digital logic circuit according to an exemplary embodiment may perform a high-speed gating operation and have a relatively robust characteristic against a leakage or an input noise.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A digital logic circuit comprising:
    a first dynamic logic gate that logically gates a plurality of first input data in response to a first clock signal, and outputs a first gating output;
    a pulse signal generating unit that generates a first pulse signal in response to an edge of the first clock signal;
    a second dynamic logic gate that logically gates the first gating output of the first dynamic logic gate and a plurality of second input data in response to a delayed first clock signal and the first pulse signal, and outputs a second gating output; and
    a latching device that latches the second gating output of the second dynamic logic gate in response to the first pulse signal.

2. The digital logic circuit of claim 1, wherein the first dynamic logic gate comprises:
    a pre-charge transistor having a gate connected to receive the first clock signal and a source connected with a power supply terminal;
    a discharge transistor having a gate connected to receive the first clock signal and a ground source; and
    a pull-down network connected between a drain of the pre-charge transistor and a drain of the discharge transistor and receiving the plurality of first input data.

3. The digital logic circuit of claim 2, wherein the second dynamic logic gate comprises:
    a pre-charge transistor having a gate connected to receive the first pulse signal and a source connected with the power supply terminal;
    a discharge transistor having a gate connected to receive a second pulse signal and a ground source; and
    a pull-down network connected between a drain of the pre-charge transistor and a drain of the discharge transistor and receiving the first gating output of the first dynamic logic gate and the plurality of second input data.

4. The digital logic circuit of claim 3, wherein the pulse signal generating unit comprises:
    a delay unit that generates the first pulse signal by delaying the first clock signal; and
    a pulse generator that generates the second pulse signal by delaying and gating the first clock signal.

5. A digital logic circuit comprising:
    an N-stage dynamic logic gate that logically gates a plurality of first to Nth input data in response to first to Nth clock signals, the second to Nth clock signals being generated by sequentially delaying the first clock signal;
    a pulse signal generating unit that generates a first pulse signal in response to an edge of the first clock signal;
    a second dynamic logic gate that logically gates a last gating output of the N-stage dynamic logic gate and a plurality of last input data in response to a delayed first clock signal and the first pulse signal; and
    a latching device that latches a gating output of the second dynamic logic gate in response to the first pulse signal.

6. The digital logic circuit of claim 5, wherein a first stage logic gate of the N-stage dynamic logic gate comprises:
    a pre-charge transistor having a gate connected to receive the first clock signal and a source connected with the power supply terminal;
    a discharge transistor having a gate connected to receive the first clock signal and a ground source; and
    a pull-down network connected between a drain of the pre-charge transistor and a drain of the discharge transistor and receiving the plurality of first input data.

7. The digital logic circuit of claim 6, wherein the second dynamic logic gate comprises:
    a pre-charge transistor having a gate connected to receive the first pulse signal and a source connected with the power supply terminal;
    a discharge transistor having a gate connected to receive the first pulse signal and a ground source; and
    a pull-down network connected between a drain of the pre-charge transistor and a drain of the discharge transistor and receiving the last gating output of the N-stage dynamic logic gate and a plurality of last input data.

* * * * *